United States Patent
Liao et al.

(10) Patent No.: US 9,025,709 B2
(45) Date of Patent: May 5, 2015

(54) RECEIVER FRONT-END CIRCUIT, COMMUNICATION UNIT AND METHOD THEREFOR

(71) Applicant: Mediatek Inc., Hsin-Chu (TW)

(72) Inventors: Chih-Fan Liao, Taipei (TW); Ming-Da Tsai, Miaoli County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/221,302

(22) Filed: Mar. 21, 2014

(65) Prior Publication Data
US 2014/0355728 A1 Dec. 4, 2014

Related U.S. Application Data

(60) Provisional application No. 61/828,861, filed on May 30, 2013.

(51) Int. Cl.
*H04B 1/10* (2006.01)
*H04L 1/00* (2006.01)

(52) U.S. Cl.
CPC .............. *H04B 1/10* (2013.01); *H04L 1/0036* (2013.01)

(58) Field of Classification Search
USPC ............... 375/316, 349, 346, 340, 324, 261; 455/132, 137, 146, 209
See application file for complete search history.

(56) References Cited

U.S. PATENT DOCUMENTS

| 8,422,979 B2 | 4/2013 | Murphy |
| 8,503,967 B2 | 8/2013 | Liao |
| 2013/0070878 A1 | 3/2013 | Mirzaei |

OTHER PUBLICATIONS

Murphy, A Blocker-Tolerant Wideband Noise-Cancelling Receiver with a 2dB Noise Figure, pp. 74-75 and a page including Figure 4.1.7, ISSCC 2012 / Session 4 / RF Techniques / 4.1, 2012.

*Primary Examiner* — Phuong Phu
(74) *Attorney, Agent, or Firm* — Winston Hsu; Scott Margo

(57) ABSTRACT

A receiver front end circuit includes a low-noise amplifier including: a first receiver path having: a first low-noise transconductor to amplify a received signal and output the amplified received signal; and a first mixer to down-convert the amplified received signal. A second receiver path includes: an auxiliary receiver having: a second transconductor to output an amplified received signal; a baseband amplifier having an input port and an output port; a first resistance coupling the input port to the output port of the baseband amplifier and to convert the amplified received signal from current to voltage and set a voltage gain of the second receiver path; and a second resistance coupled from the output port of the baseband amplifier to the first mixer output. In some examples, frequency-upconversion feedback path includes a third mixer to frequency up-convert the amplified received signal at an output of the second receiver path.

20 Claims, 7 Drawing Sheets

RECEIVER FRONT-END CIRCUIT, COMMUNICATION UNIT AND METHOD THEREFOR

CROSS REFERENCE TO RELATED APPLICATIONS

This application claims the benefit of U.S. provisional application No. 61/828,861, filed on May 30, 2013 and incorporated herein by reference.

BACKGROUND

1. Field of the Invention

The field of this invention relates to receiver front end circuits comprising (at least) low-noise amplifiers and down-conversion mixers. The invention is applicable to, but not limited to, receiver front end circuits comprising inductor-less low-noise amplifiers and noise cancellation circuits for wireless communication units.

2. Background of the Invention

In the field of wireless communications, a communication receiver is a key component of a communications unit that is designed to receive and process wirelessly received signals. Often the signals are received at very low power, due to signal propagation losses attributed to transmit signals that are wirelessly radiated from a distal wireless transmitter. Thus, by the time that the wirelessly transmitted signal has reached the receiver, the amount of received signal power is very low.

Once acquired by the antenna, the received signal is typically input to a receiver front-end circuit, integrated circuit or module. The receiver front-end circuit typically comprises a Low-noise Amplifier (LNA) followed by down-conversion circuitry and associated filtering. Often, the LNA is located after an antenna switch or duplexer in a transceiver arrangement, whereby the antenna switch or duplexer separates transmit signals from receive signals passing through the antenna. The purpose of the LNA is to amplify, as much and as linearly as possible, the desired signal that is captured by the antenna. The LNA not only deals with weak desired signal but also large interferences (such as transmitter leakage attenuated not enough by the duplexer). Using an LNA, the effect of noise from subsequent stages of the receiver chain is reduced by the gain of the LNA, whilst the noise from the LNA device/circuit itself is injected directly into the received signal. Thus, noise created within the LNA is a critical factor in its design and, hence, the received signal is required to be amplified without adding noise or distortion and without the LNA consuming too much power. In this way, retrieval of the received signal is possible in the later (baseband, following down-conversion) stages of the receiver.

A good performance LNA usually features a current-mode output interface (acting as a transconductance amplifier (sometimes referred to as a 'transconductor')) and has a low-noise factor ('NF', sometimes referred to as 'F') (typically of the order of 1 dB), and should have large enough intermodulation and compression point (third order intercept point (IP3) and 1 dB compression point (P1dB)) performance. Further important criteria in the design of an LNA includes: operating bandwidth, gain flatness, stability and input and output voltage standing wave ratio (VSWR). A further critical factor in LNA design is to obtain a good impedance match between the antenna and the LNA input. Often, the solution to this potential problem has been to use on-chip LNAs using a common-source coupled transistor with inductive source degeneration. The inductor at the source resonates at the desired frequency to obtain real valued input impedances. However, due to the resonance effect of inductor circuits, the bandwidth for this type of LNA is low and sometimes unacceptable for cellular phone application that must be able to receive signals over a wide range of frequencies, say from 850 MHz to 2.5 GHz.

In current cellular phone handsets, one solution is to implement a number of LNAs in order to cover the whole of the desired bandwidth. A switch activates the appropriate LNA according to the frequency to be received. In this solution each LNA has its own inductors, which provides good gain and low-noise, but at the cost of a larger integrated circuit. Inductors use a lot of area on chip and all the matching components off chip use valuable PCB area. To make matters worse inductors on chip require expensive manufacturing steps in order to achieve a high 'Q' factor.

Hence, there has been a recent trend to investigate receiver front-end designs that are inductor-less, which often employ noise cancellation in order to achieve low-noise. However, it is known that in designing LNAs without inductors (i.e. inductor-less), it is typically very hard to achieve high linearity together with a good noise factor (NF), since the 'active' input matching that is required, due to the removal of inductors, in order to provide efficient signal power transfer, can adversely limit both the linearity and noise figure (NF) performance of the LNA.

FIG. 1 illustrates a simplified circuit diagram of a receiver front end circuit 100 comprising a noise-cancelling cascode CMOS LNA arrangement, as described in U.S. Pat. No. 8,503,967 B2. The primary purpose of the noise-cancelling function in the illustrated receiver front end circuit 100 is to achieve an inductor-less front-end design. Here, to illustrate the NF limiting effect of an inductor-less LNA, the receiver front end circuit 100 comprises a source (represented by an input signal 105 with a source resistance ($R_S$) 110). A cascade arrangement for CMOS transistors 115, 120 comprises a feedback resistance $R_{FB}$ 125. The receiver front end output 140 is illustrated as being a summation of the output of first and second transconductance amplifiers 130, 135. With the input signal matched to the source resistance ($R_S$ 110), it is known that the noise factor F of the receiver front end circuit may be derived as follows:

Input matching of source resistance ($R_S$ 110) may be defined as:

$$R_S = \frac{R_{FB} + r_{oa}}{1 + g_{ma}r_{oa}} \quad [1]$$

Where:
$R_S$=Source resistance;
$R_{FD}$=Feedback resistance;
$r_{oa}$=the internal resistance of the transconductance operational amplifiers; and
$g_{ma}$=gain of the CMOS transistors 115, 120 ($M_{a1}/M_{a2}$).

In order to cancel noise generated in CMOS transistors 115, 120 ($M_{a1}/M_{a2}$), the gain ($G_{m2}$) of the second transconductance amplifier 130 may be defined as:

$$G_{m2} = \frac{R_S}{R_{FB} + R_S} G_{m1} \quad [2]$$

Thus, it can be readily appreciated that the gain of the second (noise cancelling) transconductance amplifier 130 is controllably less than the gain of the main (first) low-noise transconductance amplifier 135. The noise figure of the receiver front end circuit may then be defined as:

$$F = 1 + \underbrace{\frac{4\gamma}{G_{m1}R_S}\left(\frac{1+R_{FB}/R_S}{1+(2R_{FB}-1/g_{ma})/R_S}\right)^2}_{G_{m1}noise}\underbrace{\left(1+\frac{1}{1+R_{FB}/R_S}\right)}_{G_{m2}noise}+ \quad [3]$$

$$\left.\underbrace{\frac{4R_{FB}R_S}{(2R_{FB}+R_S-1/g_{ma})^2}}_{R_{FB}noise}\right|$$

Where:

γ=bias-dependent thermal noise factor;

From equation [3], it is clear that the noise of the devices used for input matching ($M_{a1}$ and $M_{a2}$) is cancelled and the noise figure is now dominated by the noise in the main (first) low-noise transconductance amplifier 135.

FIG. 2 illustrates a simplified representation 200 of a noise-cancelling cascode CMOS receiver front end circuit, highlighting a linearity bottleneck effect of an inductor-less LNA problem, as identified by the inventors. In effect, a linearity bottleneck may occur in the circuit's operation if a third transconductor ($G_{m3}$) is an out-of-phase gm cell, compared with the main (first) transconductor $G_{m1}$ 135. In one example, the 3rd transconductor may not be low-noise as its noise is suppressed by the voltage gain amplifier 230, whereas the 1st (main) transconductor may be low-noise.

if we assume that $g_{ma}r_{oa} \gg 1$ and $R_{FB} \gg r_{oa}$, the noise factor F of the circuit of FIG. 2 may be defined as:

$$F \cong 1 + \frac{\gamma}{G_{m1}R_S} + \frac{R_S}{R_{FB}} \quad [4]$$

The two basic problems of the 1st-generation noise-cancelling receiver front end circuit are:

(i) Low intrinsic gain of the input-matching voltage gain amplifier 230, which harms the noise generated from $R_{FB}$ 120, low-noise transconductance amplifier $G_{m1}$ 135, and noise-cancelling transconductor $G_{m3}$ 205. Notably, this situation worsens for higher radio frequencies and in more advanced CMOS processes.

(ii) The voltage gain of voltage gain amplifier 230 is necessary for the shunt-shunt feedback used to provide input 50 ohm matching. It therefore may produce a large voltage swing at the input of the third transconductor ($G_{m3}$), 205, thereby degrading the linearity exhibited by the third transconductor ($G_{m3}$) and causing a potential linearity bottleneck in the circuit (e.g. making the circuit operate nonlinearly):

Referring now to FIG. 3, a further simplified known LNA circuit 300, employing a frequency-translation feedback receiver is illustrated. The LNA circuit 300 comprises a radio frequency input 305 to a transconductance amplifier ($G_m$), 310. In contrast to the architecture shown in FIG. 1, where the shunt-shunt feedback gain required for input matching is provided by a single-stage transconductor (Ma1 and Ma2), the gain used for feedback in this figure is provided by the entire receiver front-end. Therefore, the feedback resistor $R_f$ would typically be quite large to reduce its noise. The noise figure can be proved to be the same as that described in [4]. One problem of the architecture of FIG. 3 is the nonlinearity generated by the TIA, due to the large voltage gain (and hence swing) at the TIA output.

Thus, a need exists for an improved higher-performance inductor-less LNA, for example suitable for next-generation receivers, and a method of operation therefor. In particular, a need exists for an improved receiver front-end architecture that exhibits better performance and/or dynamic range with respect to NF and linearity.

SUMMARY

Accordingly, the invention seeks to mitigate, alleviate or eliminate one or more of the above mentioned disadvantages singly or in any combination. Aspects of the invention provide a low-noise amplifier circuit and an integrated circuit therefor as described in the appended claims.

According to a first aspect of the invention, there is provided a receiver front end circuit comprising a low-noise amplifier with a primary (first) receiver path and a second (auxiliary) receiver path. The first receiver path comprises: a first low-noise transconductor arranged to amplify a received signal and output the amplified received signal; and a first mixer arranged to down-convert the amplified received signal. A second receiver path comprises an auxiliary receiver comprising: a second transconductor arranged to amplify the received signal and output an amplified received signal; a second mixer arranged to down-convert the amplified received signal; a baseband amplifier that has an input port and an output port; and a first resistance operably couples the input port to the output port of the baseband amplifier and is arranged to convert the amplified received signal from current to voltage and set a voltage gain of the second receiver path. A second resistance is operably coupled from the output port of the baseband amplifier to the first mixer output.

According to an optional feature of the invention, the receiver front end circuit may further comprise a frequency-upconversion feedback path comprising a third mixer arranged to frequency up-convert the amplified received signal at an output of the second receiver path and apply the frequency up-converted received signal to the input of the first low-noise transconductor and second transconductor via a third feedback resistance.

In this manner, the second transconductor and the baseband amplifier may be low-power, not only because most of the gain is provided by the first resistance, but also because the noise produced by the secondary receiver can be up-converted by the frequency-upconversion feedback path and subsequently down-converted and cancelled at the combination point of the first-mixer output.

The second transconductor of the second (auxiliary) receiver path may be arranged to only contribute little voltage-to-current gain to save current consumption, with most gain provided by the first resistance, e.g. a first resistor. In some examples, the second resistance may be a resistor (which is perfectly linear) that is selected and arranged to replace a third transconductor of prior art circuits, thereby negating the aforementioned linearity bottleneck.

According to an optional feature of the invention, the LNA may be an inductor-less LNA.

According to an optional feature of the invention, the first resistance may be a first resistor arranged to set a loop gain of the second receiver path at an intermediate or baseband frequency, for example in order to provide a large gain independent of the input signal's radio frequency.

According to an optional feature of the invention, the second resistance ($R_2$) may be arranged to create a substantially out-of-phase and substantially equal amplitude noise level of the received signal in the second receiver path to a noise level of the received signal routed, say via an up-conversion feedback path comprising an up-conversion mixer and a feedback resistor, and then first low-noise transconductor and first mixer in the first receiver path.

In one example, the output of the second receiver path feedback path further comprises a phase invertor arranged to provide a negative feedback input to the third mixer. The phase invertor may be arranged to lower a reciprocal mixing spur effect on the third mixer following down-conversion by the second mixer.

According to an optional feature of the invention, the third mixer may comprise a differential output used to realize the phase invertor.

According to an optional feature of the invention, at least one of the first mixer, second mixer, third mixer may be a quadrature mixer coupled to a differential input of a respective transconductor.

According to an optional feature of the invention, at least one of the first mixer, second mixer, third mixer may be a single-ended mixer coupled to a single-ended input of a respective transconductor.

According to an optional feature of the invention, the second transconductor may be arranged to operate at a current level that is a factor (for example in a range of one half to one twentieth) smaller than the first low-noise transconductor.

According to an optional feature of the invention, the second mixer may also be a factor smaller in size and/or operational requirements than the first mixer.

According to a second aspect of the invention, there is provided a communication unit comprising the (inductor-less) low-noise amplifier of the first aspect.

According to a third aspect of the invention, there is provided a method for a receiver front end circuit, the method comprising: receiving wirelessly a received signal; amplifying the received signal in a first path with a first low-noise transconductor; down-converting the amplified received signal. The method further comprises amplifying the received signal in a second path comprising an auxiliary receiver and a second transconductor; down-converting the amplified received signal; converting the amplified received signal from current to voltage; and setting a voltage gain of the second receiver path via a first resistance operably coupling an input port to an output port of a baseband amplifier arranged to receive the down-converting amplified received signal. In one example, the method further comprises providing an input 50 ohm matching via a frequency-upconversion feedback path and the second resistance.

According to an optional feature of the invention, the method may further comprise combining the second receiver path with the first receiver path via the second resistance, in which the connection makes the noise and distortion generated by the second receiver being cancelled at the first receiver output.

According to a fourth aspect of the invention, there is provided a receiver front end circuit comprising a low-noise amplifier with a primary (first) receiver path and a second (auxiliary) receiver path. The first receiver path comprises: a first low-noise transconductor arranged to amplify a received signal and output the amplified received signal; and a first mixer arranged to down-convert the amplified received signal. A second receiver path comprises an auxiliary receiver comprising: a second transconductor arranged to amplify the received signal and output an amplified received signal; a second mixer arranged to down-convert the amplified received signal; a baseband amplifier that has an input port and an output port; and a first resistance operably couples the input port to the output port of the baseband amplifier and is arranged to convert the amplified received signal from current to voltage and set a voltage gain of the second receiver path. A frequency-upconversion feedback path comprises a third mixer arranged to frequency up-convert the amplified received signal at an output of the second receiver path and apply the frequency up-converted amplified received signal to the input of the first low-noise transconductor and second transconductor via a third feedback resistance.

In this manner, by applying a third mixer arranged to frequency up-convert the amplified received signal at an output of the second receiver path and apply the frequency up-converted amplified received signal to the input of the first low-noise transconductor and second transconductor via a third feedback resistance, the noise at the second receiver (auxiliary) path output is upconverted back to the RF input and then passing through first low-noise transconductor and first mixer with opposite phase.

In some optional examples, the noise at the second receiver (auxiliary) path output may then be cancelled at the first-mixer output via a second resistance.

According to a fifth aspect of the invention, there is provided a communication unit comprising the (inductor-less) low-noise amplifier of the fourth aspect.

According to a sixth aspect of the invention, there is provided a method for a receiver front end circuit, the method comprising: receiving wirelessly a received signal; amplifying the received signal in a first path with a first low-noise transconductor; down-converting the amplified received signal. The method further comprises amplifying the received signal in a second path comprising an auxiliary receiver and a second transconductor; down-converting the amplified received signal; converting the amplified received signal from current to voltage; and setting a voltage gain of the second receiver path via a first resistance operably coupling an input port to an output port of a baseband amplifier arranged to receive the down-converting amplified received signal. The method further comprises frequency-upconverting via a feedback path the amplified received signal at an output of the second receiver path; and applying the frequency up-converted amplified received signal to the input of the first low-noise transconductor and second transconductor via a third feedback resistance.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Figure 1:
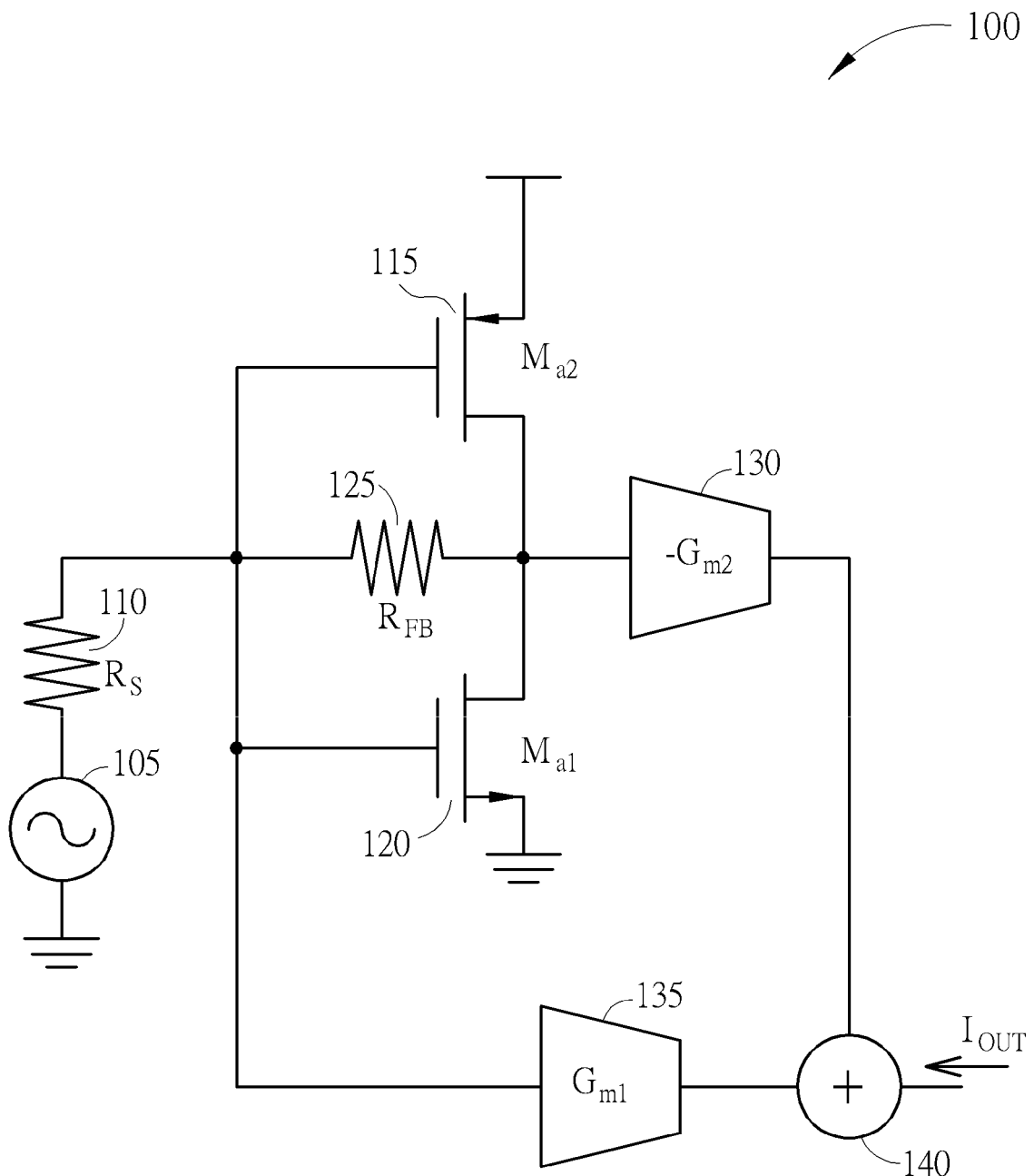
FIG. 1 illustrates a simplified circuit of a known noise cancelling low-noise amplifier, as described in U.S. Pat. No. 8,503,967 B2.

Examples of the invention will be described in terms of a receiver front end circuit for a wireless communication unit, such as an user equipment. The receiver front end circuit comprises a low-noise amplifier comprising: a first receiver path comprising: a first low-noise transconductor arranged to amplify a received signal and output the amplified received signal; and a first mixer arranged to down-convert the amplified received signal. A second receiver path comprises: an auxiliary receiver comprising: a second transconductor arranged to amplify the received signal and output an amplified received signal; a baseband amplifier having an input port and an output port; a first resistance operably coupling the input port to the output port of the baseband amplifier and arranged to convert the amplified received signal from current to voltage and set a voltage gain of the second receiver path; and a second resistance operably coupled from the output port of the baseband amplifier to the first mixer output.

In some examples of the invention, a frequency-upconversion feedback path is also included that comprises a third mixer arranged to frequency up-convert the amplified received signal at an output of the second receiver path and apply the frequency up-converted received signal to the input of the first low-noise transconductor and second transconductor via a third feedback resistor for the input 50 ohm matching. In some examples of the invention, the second receiver path may be used to generate the gain required for input 50 ohm matching (in a similar manner to Gm2 in FIG. 2). In some examples of the invention, the noise of the second receiver path is cancelled by connecting (combining) its output to the main receiver path through the second resistance.

In this manner, the second transconductor of the second (auxiliary) receiver path is arranged to only contribute little signal gain, with most gain provided by careful selection of the first resistor in operation with the baseband amplifier in order to provide a large gain independent of the input signal's radio frequency.

Examples of the invention will be additionally or alternatively described in terms of a receiver front end circuit comprising a low-noise amplifier with a primary (first) receiver path and a second (auxiliary) receiver path. The first receiver path comprises: a first low-noise transconductor arranged to amplify a received signal and output the amplified received signal; and a first mixer arranged to down-convert the amplified received signal. A second receiver path comprises an auxiliary receiver comprising: a second transconductor arranged to amplify the received signal and output an amplified received signal; a second mixer arranged to down-convert the amplified received signal; a baseband amplifier that has an input port and an output port; and a first resistance operably couples the input port to the output port of the baseband amplifier and is arranged to convert the amplified received signal from current to voltage and set a voltage gain of the second receiver path. A frequency-upconversion feedback path comprises a third mixer arranged to frequency up-convert the amplified received signal at an output of the second receiver path and apply the frequency up-converted amplified received signal to the input of the first low-noise transconductor and second transconductor via a third feedback resistance.

In this manner, by applying a third mixer arranged to frequency up-convert the amplified received signal at an output of the second receiver path and apply the frequency up-converted amplified received signal to the input of the first low-noise transconductor and second transconductor via a third feedback resistance, the noise at the second receiver (auxiliary) path output is upconverted back to the RF input and then passing through first low-noise transconductor and first mixer with opposite phase. In some examples, the noise at the second receiver (auxiliary) path output may then be cancelled at the first-mixer output via a second resistance.

Although, examples of the invention have been described with reference to an inductor-less LNA, it is envisaged that the inventive concept may be employed by an inductive-degeneration LNA.

However, it will be appreciated by a skilled artisan that the inventive concept herein described may be embodied in any type of receiver front end circuit comprising at least one low-noise amplifier. Furthermore, it is envisaged that the inventive concept is not limited to use in a 3GPP™ UE, but may equally be employed in any wireless receiver, such as GSM, EDGE, TD-SCDMA, WiFi, Bluetooth (BT), etc.

Figure 4:
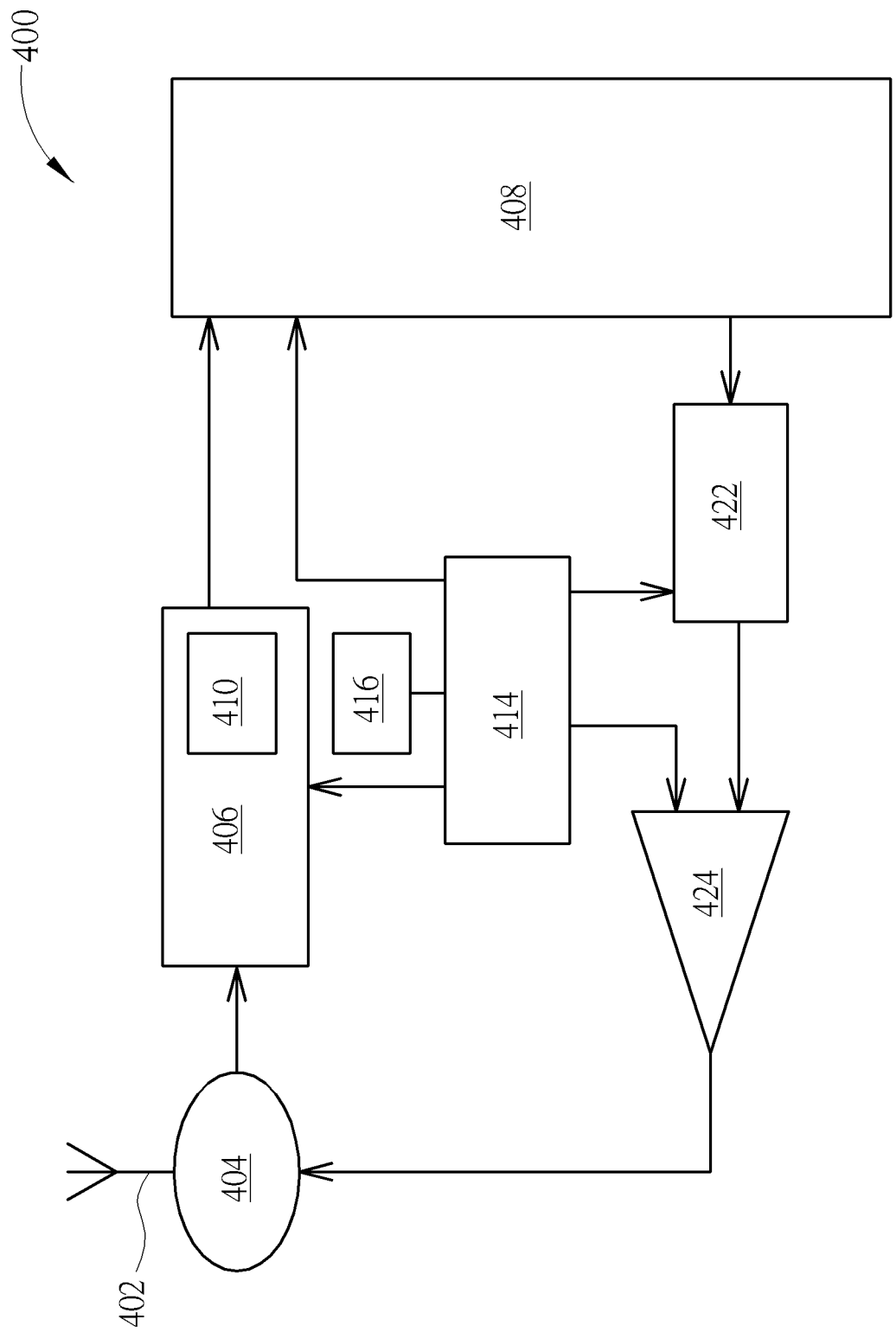
FIG. 4 illustrates an example block diagram of a communication unit adaptable to implement concepts of the invention.

Referring first to FIG. 4, a block diagram of a wireless communication unit (sometimes referred to as a mobile subscriber unit (MS) in the context of cellular communications or a user equipment (UE) in terms of a $3^{rd}$ generation partnership project (3GPP) communication system) is shown, in accordance with a preferred embodiment of the invention. The wireless communication unit 400 contains an antenna 402 preferably coupled to a duplex filter or antenna switch 404 that provides isolation between receive and transmit chains within the wireless communication unit 400.

The receiver chain, as known in the art, includes receiver front-end circuitry 406 optionally comprising band-pass filtering at the pass-band of received signals, a low-noise amplifier 410, noise cancellation components and/or circuitry, optional further band-pass filtering to remove harmonic terms following amplification, and intermediate or base-band frequency conversion, adapted according to example embodiments of the invention. The front-end circuitry 406 is coupled to a baseband signal processing function 408 (generally realised by a digital signal processor (DSP), which includes receiver base-band processing circuitry (not shown). An output from the signal processing function 408 is provided to a suitable output device 410, such as a screen or flat panel display. The receiver chain also includes a controller 414 that maintains overall subscriber unit control and is also coupled to the receiver front-end circuitry 406 and the signal processing function 408. The controller is also coupled to a memory device 416 that selectively stores operating regimes, such as decoding/encoding functions, synchronisation patterns, code sequences, received signal strength data, and the like.

For completeness, as regards the transmit chain, this essentially includes an input device 420, such as a keypad, coupled in series through transmitter/modulation circuitry 422 and a power amplifier 424 to the antenna 402. The transmitter/modulation circuitry 422 and the power amplifier 424 are operationally responsive to the controller 414.

The various components within the wireless communication unit 400 can be realised in discrete or integrated component form, with an ultimate structure therefore being merely an application-specific or design selection. In accordance with examples of the invention, the receiver front-end circuitry 406 has been adapted to resolve some of the aforementioned problems with known LNAs and receiver front-end circuits, as described below with respect to the circuit designs of FIG. 5 and FIG. 6.

Figure 5:
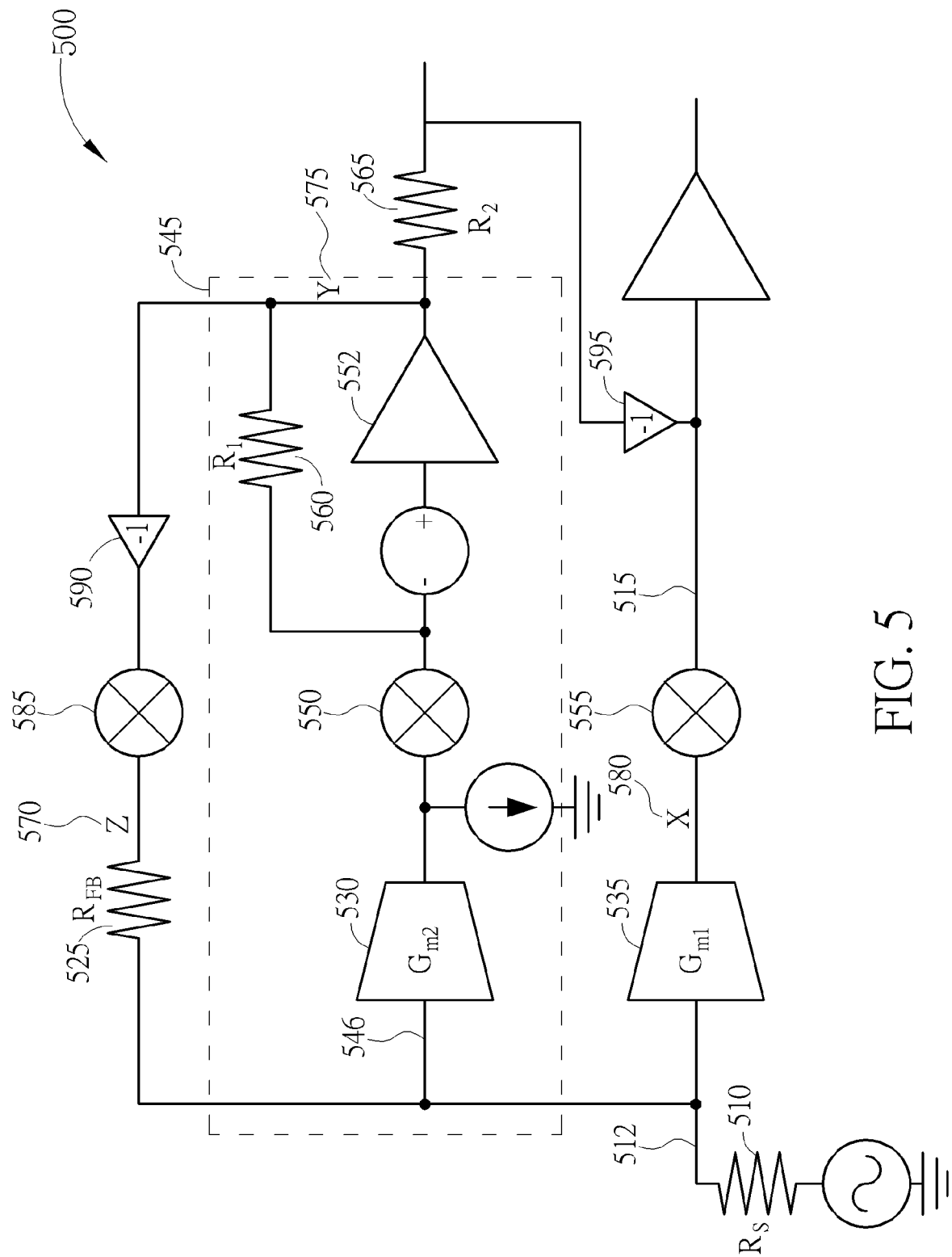
FIG. 5 illustrates an example receiver front end circuit comprising a low-noise amplifier, noise cancellation circuit and frequency-conversion stages according to example embodiments of the invention.

Referring now to FIG. 5, an example receiver front end circuit 500 comprising a main receiver path 515 is illustrated, for example as may be implemented as receiver front-end circuitry 406 of FIG. 4. The main receiver path 515 comprises a (first, primary) low-noise transconductance amplifier/transconductor ($G_{m1}$) 535 arranged to amplify a received signal and output the amplified received signal; and a first down-conversion mixer 555 arranged to down-convert the amplified received signal following multiplying (mixing) with a local oscillator (LO) signal (not shown), according to example embodiments of the invention.

In accordance with example embodiments, the auxiliary receiver circuit 545 comprises a second transconductance amplifier/transconductor ($G_{m2}$) 530 arranged to also amplify the received signal and output an amplified received signal. A second mixer 550 is arranged to down-convert the amplified received signal to an intermediate frequency (IF) or baseband signal via use of the same local oscillator (LO) signal (not shown). An intermediate frequency (IF) amplifier or baseband amplifier 552 and resistance R1 560 are arranged to convert (respectively at IF or baseband) the down-converted received signal from current to voltage with further amplification and set a voltage gain of the second receiver path.

A third mixer (MIX3) 585 is arranged to up-convert the inverted (via inverter 595 in order to avoid the system becoming unstable) amplified signal to one end of the feedback resistance 525. The third mixer (MIX3) 585 and feedback resistance 525 create a 50 ohm input impedance at the receiver input. In some examples, the auxiliary receiver is arranged to create a large voltage gain across the feedback resistance 525, such that its noise can be minimized.

Figure 3:
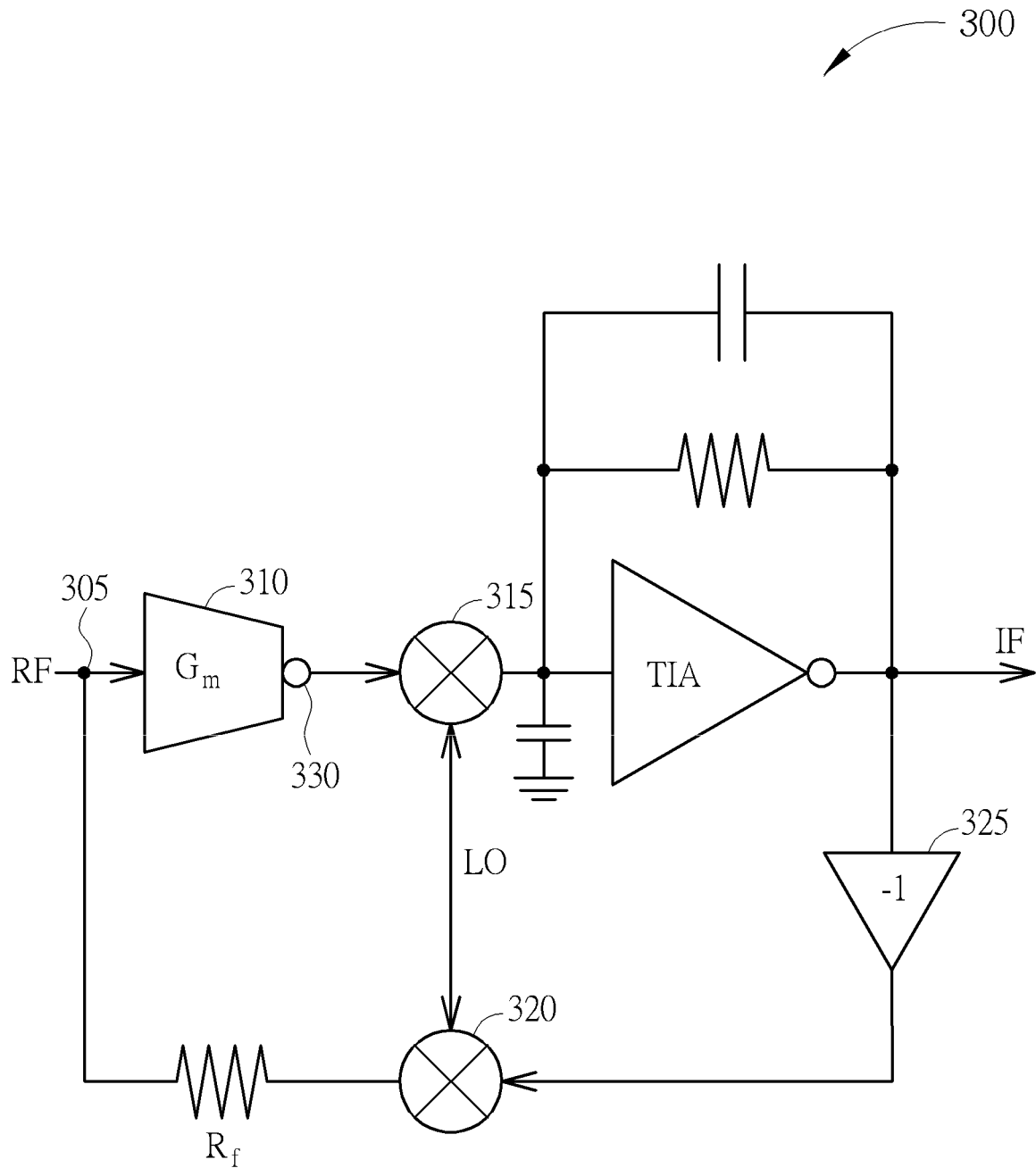
FIG. 3 illustrates a further simplified known LNA simulation circuit identifying a reciprocal mixing arrangement.

The output of the auxiliary receiver circuit (at node 'Y') is combined with the main receiver path via resistance R2 565 and phase invertor 595. In this manner, the noise and distortion generated in the auxiliary receiver circuit (comprising second transconductor ($G_{m2}$) 530, second mixer (MIX2) 550, R1 560, and baseband amplifier 552), fed back via feedback path and the feedback resistance 525, can be cancelled at the first mixer (MIX1) 555 output, in contrast to the architecture shown in FIG. 3.

In one example embodiment, the gain ($G_{AUX}$) of the aux-RX 545 may be maximized so as to lower the noise from the feedback resistance 525, by appropriate selection of resistance R1 560 of amplifier 552. In this example, resistance R1 560 associated with amplifier 552 is operated at IF (down-converted by second mixer 550). Therefore, resistance R1 560 of amplifier 552 is advantageously independent of the operating radio frequency of the received signal. In particular, the value of resistance (R1) 560 is chosen to obtain the desired aux-RX gain, whereby it is notably much easier to provide large gain at the down-converted IF.

In contrast, the linearity of the main path is not as adversely affected by the in-band blocker, due to the current mode interface at node 'X' 580 being low impedance.

The fact that the noise and distortion generated in the auxiliary receiver circuit may be cancelled enables transconductor ($G_{m2}$) 530 to be designed to be a factor smaller, in order to save current, for example of the order of ~½ to ~1/20, and in some preferred implementations ~1/10, of first low-noise transconductor ($G_{m1}$) 535.

Additionally, second mixer (MIX2) 550 may be made proportionally a factor smaller than first mixer (MIX1) 555, as their ratio is determined by the ratio of second transconductor ($G_{m2}$) 530 to first low-noise transconductor ($G_{m1}$) 535.

Figure 2:
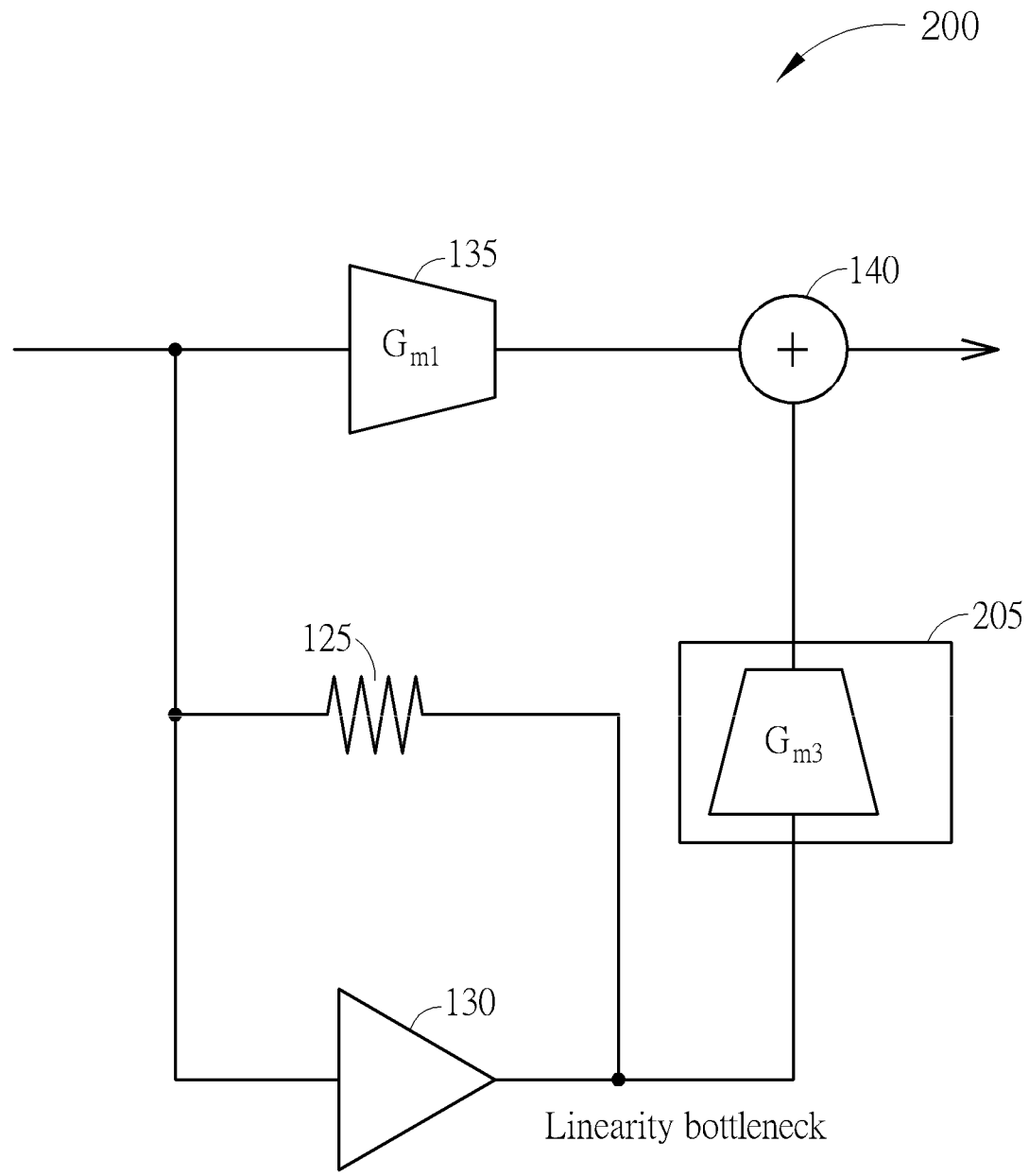
FIG. 2 illustrates a further simplified simulation circuit of the circuit of FIG. 1 identifying a potential linearity bottleneck in an inductor-less LNA design.

In accordance with example embodiments of the invention, and advantageously, the third ($G_{m3}$) transconductance amplifier of known LNA circuits, such as transconductance amplifier ($G_{m3}$) 205 of FIG. 2, can be advantageously replaced by a suitably selected output resistance ($R_2$) 565, which is perfectly linear. In some examples, output resistance ($R_2$) 565 is selected according to the particular noise and distortion cancellation condition to be experienced.

Hence, by careful selection of the value of output resistance ($R_2$) 565 (when replacing third transconductance amplifier ($G_{m3}$) in prior art designs), it is possible to create a substantially out-of-phase and substantially equal amplitude noise in the auxiliary receiver path 545 when compared with noise passing through the main path, which facilitates noise and distortion cancelling and enables an inductor-less LNA to be used in the receiver front-end design. In some examples, output resistance ($R_2$) 565 may be an output resistor. In some examples, the substantially out-of-phase and substantially equal amplitude noise in the auxiliary receiver path 545, when compared with noise passing through the main path, may be of any phase or amplitude noise that is sufficient to cancel noise to an acceptable level in the receiver front-end design.

In one example, any phase shift noise caused by the LO and/or Gm stage may be compensated by applying interpolation on the output resistance (R2) on the auxiliary (second) receiver path, in order to provide improved noise cancellation. For example, in some implementations, an interpolation factor of 0.4 has been found to be equivalent to a 20° phase shift.

In one example, the value for the feedback resistance 525 of FIG. 5 may be selected according to:

$$R_{FB} = (1 + G_{AUX}/A_{MN})R_S \quad [5]$$

The feedback signal is then applied to the input 546 of the second transconductor ($G_{m2}$) 530, as well as the input 512 of the main receiver path 515 and, as such, the input of first (primary) low-noise transconductor ($G_{m1}$) 535.

It can be seen that the larger intrinsic gain of the aux-Rx 545 provides a comparably better NF with a smaller noise from feedback resistance 525. It is noteworthy that this offers advantages over the prior art requirement of voltage gain for Gm2 with resistive feedback for input matching.

Equation [6] defines the value of R2 560 that results in cancellation of noise and distortion generated by the aux-RX 545.

$$R_2 = \frac{1}{\alpha G_{m1}}\left(1 + \frac{R_{FB}}{R_S}\right) \cong \frac{R_{FB}}{\alpha G_{m1} R_S} \quad [6]$$

In particular, it can be observed that the distortion at node 'Y' 575 may include the distortion from second transconductor ($G_{m2}$) 530 and the output from the aux-Rx 545, and, similar to the noise cancellation, the distortion can be cancelled at the combined output.

In one example, $R_{FB}$ 525 may be selected to be >10 times larger than the input resistance ($R_{IN}$), which may reduce the local oscillator leakage from the third mixer stage (MIX3) 585. Any additional distortion introduced by first low-noise transconductor ($G_{m1}$) 535 is relatively small, because node 'X' 580 is low impedance (low-Z).

Furthermore, any additional distortion introduced by the third mixer stage (MIX3) 585 at node 'Z' 570 needs to be considered as it should be arranged to be small compared to the distortion generated by the auxiliary receiver circuit (comprising second transconductor $G_{m2}$ 530 and baseband amplifier 552) at node 'Y' 575.

In this manner, in the example circuit 500, the noise cancellation is the same for the second transconductor ($G_{m2}$) 530 and the noise output from the aux-Rx 545. Thus, the example receiver front end circuit 500 aims to solve the aforementioned problems, in that:

(i) The gain of the auxiliary receiver 545 can be controlled by selection of amplifier resistance (R1) 560, where it is relatively easy to provide a large gain independent of the operating radio frequency; and (ii) The linearity bottleneck due to the third transconductance amplifier ($G_{m3}$) block of known inductor-less LNA designs may be replaced by output resistance (R2) 565, which is perfectly linear.

Figure 6:
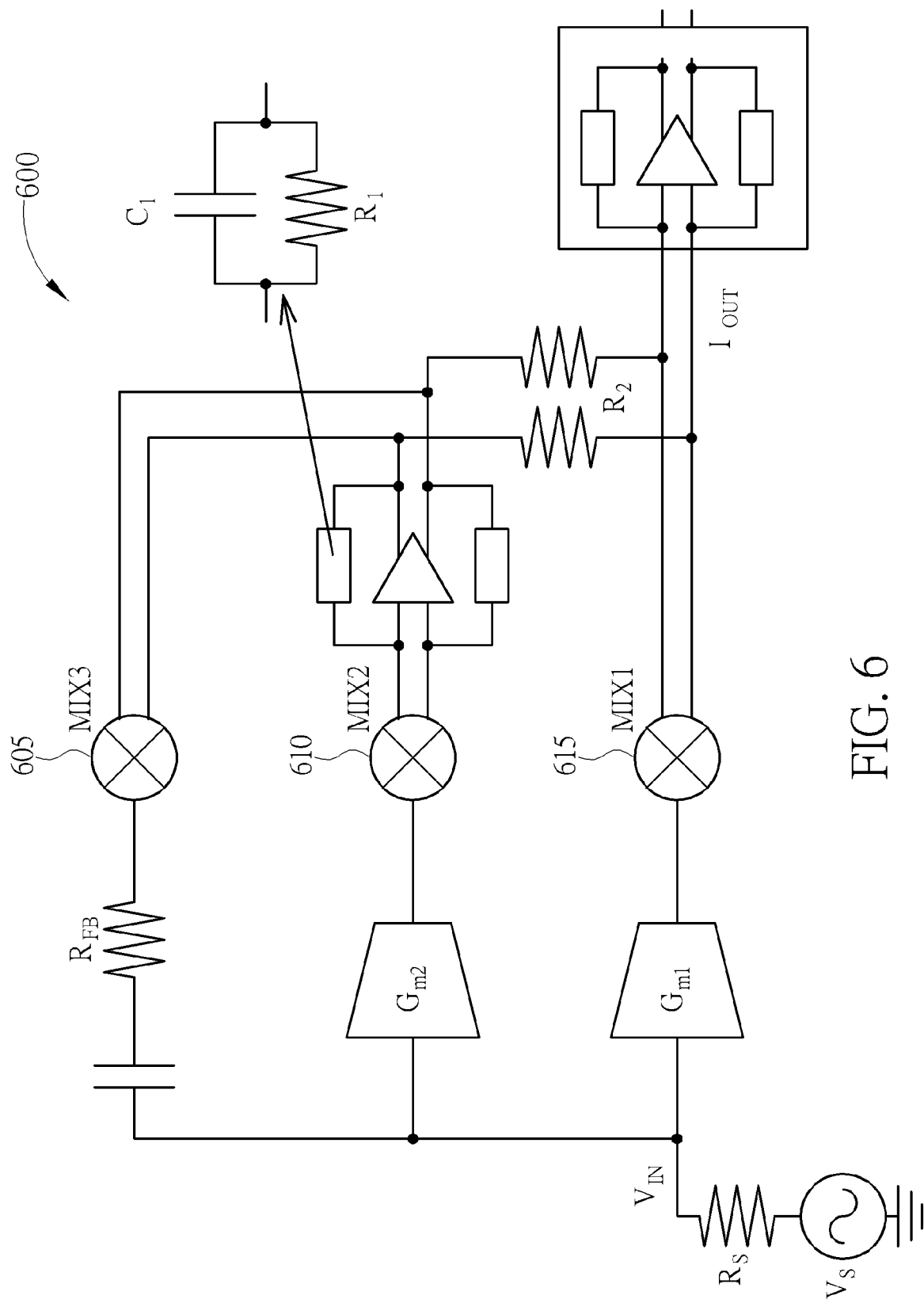
FIG. 6 illustrates a simplified circuit of example inductor-less low-noise amplifier implementation for a receiver front end circuit according to example embodiments of the invention.

Referring now to FIG. 6, a further simplified circuit of an example inductor-less low-noise amplifier implementation is illustrated, according to example embodiments of the invention. A second example circuit 600 illustrates an implementation with mixers 605, 610, 615 having single-ended input and differential outputs (typically referred to as single-balanced mixers) coupled to single-ended transconductors. In some examples, the differential outputs of mixers 605, 610, 615 may be used to realize the phase invertors (for example phase invertor 590 in FIG. 5).

Figure 7:
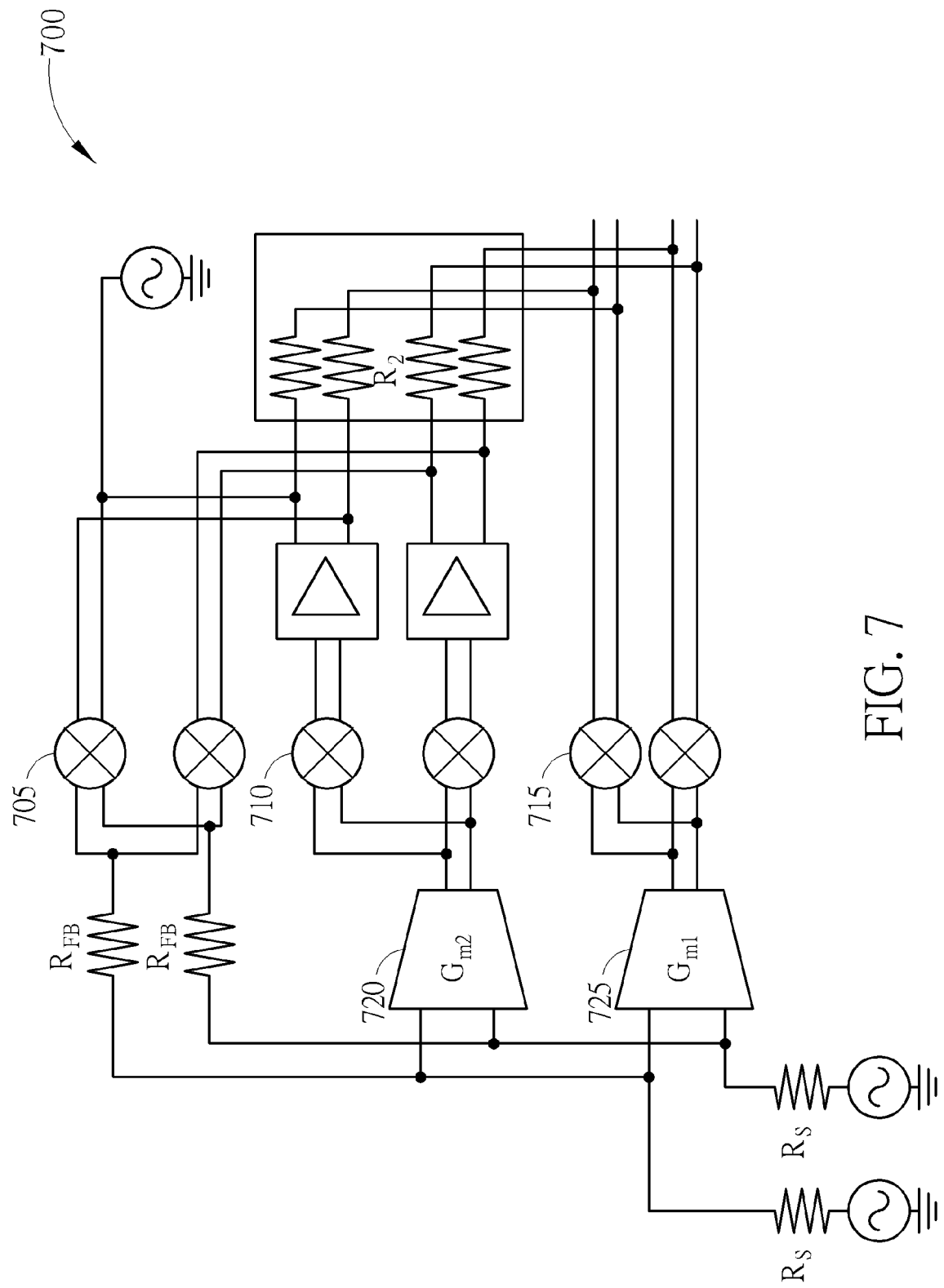
FIG. 7 illustrates a further simplified circuit of example inductor-less low-noise amplifier implementation for a receiver front end circuit according to example embodiments of the invention.

Referring now to FIG. 7, a simplified circuit of an example inductor-less low-noise amplifier implementation is illustrated, according to example embodiments of the invention. The example circuit 700 illustrates an enhanced implementation employing IQ mixers 705, 710, 715 having differential inputs and differential outputs (typically referred to as double-balanced mixers), coupled to differential transconductors 720, 725 and baseband (or IF) amplifiers. However, in other examples, it is envisaged that the IQ mixers 705, 710, 715 may have single-ended inputs and differential outputs (single-balanced mixers), coupled to single-ended transconductors and baseband (or IF) amplifiers.

Thus, in accordance with FIG. 6 or FIG. 7, transconductors Gm1 and Gm2 may also be accordingly single-ended or differential, as shown.

In summary, example low-noise amplifier designs have been described that illustrate noise and distortion cancellation. In some examples, NF may be improved by approximately >2.5 dB when noise cancellation is provided. In some examples, out-of-band $3^{rd}$ order intermodulation distortion (IIP3) may be improved by approximately 10 dB compared to known inductor-less LNAs, with similar power consumption and even better NF. In some examples, similar or better in-band third order intermodulation point (IIP3) performance may be achieved under the same NF conditions by applying distortion cancellation. Additionally, the IP performance in example embodiments is less dependent on the radio frequency, whereas the loop gain for shunt-shunt feedback is dependent upon it being provided at intermediate or baseband frequency.

In some examples, the overall reciprocal mixing effect of the example embodiments has been analyzed, and has been shown to be similar to traditional receiver architectures, even when two more mixers are employed. In the examples illustrated in FIGS. 5 to 7, the third mixer (MIX3) reciprocal-mixing spur may be lowered by introducing negative feedback. In some examples, the second mixer (MIX2) reciprocal-mixing spur may be cancelled, in the same manner as noise in the aux-RX. In some examples, and advantageously, the gain ($G_{AUX}$) in the aux-RX may be adjusted independently of the main receiver path gain, which creates more freedom in optimizing the noise and linearity.

In particular, it is envisaged that the aforementioned inventive concept can be applied by a semiconductor manufacturer to any integrated circuit for a radio receiver comprising a low-noise amplifier. Furthermore, the inventive concept can be applied to any amplifier circuit. It is further envisaged that, for example, a semiconductor manufacturer may employ the inventive concept in a design of a receiver circuit, a stand-alone device such as a front-end receiver integrated circuit, or an application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements.

Furthermore, although individually listed, a plurality of means or elements may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate. Furthermore, singular references do not exclude a plurality. Thus, references to 'a', 'an', 'first', 'second', etc. do not preclude a plurality.

Thus, an improved low-noise amplifier module has been described, wherein the aforementioned disadvantages with prior art arrangements have been substantially alleviated.

What is claimed is:

1. A receiver front end circuit comprising a low-noise amplifier comprising:
   a first receiver path comprising:
      a first low-noise transconductor arranged to amplify a received signal and output the amplified received signal of the first receiver path; and
      a first mixer arranged to down-convert the amplified received signal of the first receiver path;
   a second receiver path comprising an auxiliary receiver comprising:
      a second transconductor arranged to amplify the received signal and output an amplified received signal of the second receiver path;
      a second mixer arranged to down-convert the amplified received signal of the second receiver path;
      a baseband amplifier having an input port and an output port;
      a first resistance operably coupling the input port to the output port of the baseband amplifier and arranged to convert the down-converted amplified received signal of the second receiver path from current to voltage and set a voltage gain of the second receiver path; and
      a frequency-upconversion feedback path comprising a third mixer arranged to frequency up-convert the amplified received signal of the second receiver path at an output of the second receiver path and apply the frequency up-converted amplified received signal of the second receiver path to the input of the first low-noise transconductor and second transconductor via a third feedback resistance.

2. The receiver front end circuit of claim 1 further comprising a second resistance operably coupled to the output port of the baseband amplifier.

3. The receiver front end circuit of claim 1 wherein the frequency-upconversion feedback path further comprises a phase invertor arranged to provide a negative feedback input to the third mixer.

4. The receiver front end circuit of claim 2 wherein the second resistance is arranged to create a substantially out-of-phase and substantially equal amplitude noise level of the received signal in the second receiver path to a noise level of the received signal routed via the first low-noise transconductor and the first mixer in the first receiver path.

5. The receiver front end circuit of claim 4 wherein the third mixer comprises a differential output used to realize a phase invertor.

6. The receiver front end circuit of claim 1 wherein at least one of the first mixer, the second mixer, and the third mixer is a quadrature mixer coupled to a differential or single-ended input of a respective transconductor.

7. The receiver front end circuit of claim 1 wherein at least one of the first mixer, the second mixer, and the third mixer is a single-ended mixer coupled to a single-ended input of a respective transconductor.

8. The receiver front end circuit of claim 1 wherein the second transconductor is arranged to operate at a current level that is a factor smaller than the first low-noise transconductor.

9. The receiver front end circuit of claim 8 wherein the factor of current level employed by the second transconductor is in a range of one half to one twentieth of a current employed by the first low-noise transconductor.

10. The receiver front end circuit of claim 1 wherein the first low-noise transconductor is an inductor-less low-noise amplifier.

11. A communication unit comprising a receiver front end circuit comprising a low-noise amplifier comprising:
 a first receiver path comprising:
  a first low-noise transconductor arranged to amplify a received signal and output the amplified received signal of the first receiver path; and
  a first mixer arranged to down-convert the amplified received signal of the first receiver path;
 a second receiver path comprising an auxiliary receiver comprising:
  a second transconductor arranged to amplify the received signal and output an amplified received signal of the second receiver path; and
  a second mixer arranged to down-convert the amplified received signal of the second receiver path;
  a baseband amplifier having an input port and an output port;
  a first resistance operably coupling the input port to the output port of the baseband amplifier and arranged to convert the down-converted amplified received signal of the second receiver path from current to voltage and set a voltage gain of the second receiver path; and
  a frequency-upconversion feedback path comprising a third mixer arranged to frequency up-convert the amplified received signal of the second receiver path at an output of the second receiver path and apply the frequency up-converted amplified received signal to the input of the first low-noise transconductor and second transconductor via a third feedback resistance.

12. The communication unit of claim 11 further comprising a second resistance operably coupled to the output port of the baseband amplifier.

13. The communication unit of claim 12 wherein the second resistance is arranged to create a substantially out-of-phase and substantially equal amplitude noise level of the received signal in the second receiver path to a noise level of the received signal routed via the first low-noise transconductor and the first mixer in the first receiver path.

14. The communication unit of claim 11 wherein the frequency-upconversion feedback path further comprises a phase invertor arranged to provide a negative feedback input to the third mixer.

15. The communication unit of claim 14 wherein the third mixer comprises a differential output used to realize the phase invertor.

16. A method for a receiver front end circuit, the method comprising:
 receiving wirelessly a received signal;
 amplifying the received signal in a first receiver path with a first low-noise transconductor;
 down-converting the amplified received signal of the first receiver path;
 amplifying the received signal in a second receiver path comprising an auxiliary receiver and a second transconductor, thereby producing an amplified received signal of the second receiver path;
 down-converting the amplified received signal of the second receiver path;
 converting the down-converted amplified received signal of the second receiver path from current to voltage;
 setting a voltage gain of the second receiver path via a first resistance operably coupling an input port to an output port of a baseband amplifier arranged to receive the down-converted amplified received signal of the second receiver paths;
 frequency-upconverting via a feedback path the amplified received signal of the second receiver path at an output of the second receiver path; and
 applying the frequency up-converted amplified received signal of the second receiver path to the input of the first low-noise transconductor and second transconductor via a third feedback resistance.

17. The method of claim 16 further comprising:
 combining the second receiver path with the first receiver path via a second resistance operably coupled to the output port of the baseband amplifier.

18. The method of claim 17 further comprising creating, by the second resistance, a substantially out-of-phase and substantially equal amplitude noise level of the received signal in the second receiver path to a noise level of the received signal routed via the first low-noise transconductor and a first mixer in the first receiver path.

19. The method of claim 16 wherein the feedback path is a frequency-upconversion feedback path comprising a third mixer.

20. The method of claim 16 further comprising operating the second transconductor at a current level that is a factor smaller than the first low-noise transconductor.

* * * * *